United States Patent [19]
Wojewoda

[11] Patent Number: 6,016,019
[45] Date of Patent: Jan. 18, 2000

[54] CAPACITOR ARRAY ARRANGEMENT FOR IMPROVING CAPACITOR ARRAY MATCHING

[75] Inventor: Igor Wojewoda, Tempe, Ariz.

[73] Assignee: Microchip Technology Incorporated, Chandler, Ariz.

[21] Appl. No.: 09/085,827

[22] Filed: May 28, 1998

[51] Int. Cl.⁷ .................................................... H03M 1/80
[52] U.S. Cl. ........................... 307/109; 341/150; 361/328; 361/329
[58] Field of Search ............................ 307/109; 341/144, 341/145, 150, 172; 361/328, 329

[56] References Cited

U.S. PATENT DOCUMENTS

| | | | |
|---|---|---|---|
| 4,611,195 | 9/1986 | Shosaku | 341/150 |
| 4,782,323 | 11/1988 | Lucas | 341/150 |
| 4,875,046 | 10/1989 | Lewyn | 341/150 |
| 5,583,738 | 12/1996 | Kohno et al. | 361/328 |
| 5,625,361 | 4/1997 | Garrity et al. | 341/172 |

*Primary Examiner*—Albert W. Paladini
*Attorney, Agent, or Firm*—Paul N. Katz; Ronald L. Chichester; Frohwitter

[57] ABSTRACT

A capacitor array layout technique for improving capacitor array matching. A capacitor array is laid out in a geometrical configuration wherein the geometrical configuration has a centerpoint. The geometrical configuration is divided into a plurality of first sections wherein each of the plurality of first sections have a corresponding second section diagonally located from and at an approximately equal distance from the centerpoint as said first section. Each of the of second sections house a capacitor set of a predetermined value wherein each of the plurality of first sections house a capacitor set of an equal value as the corresponding second section.

27 Claims, 3 Drawing Sheets

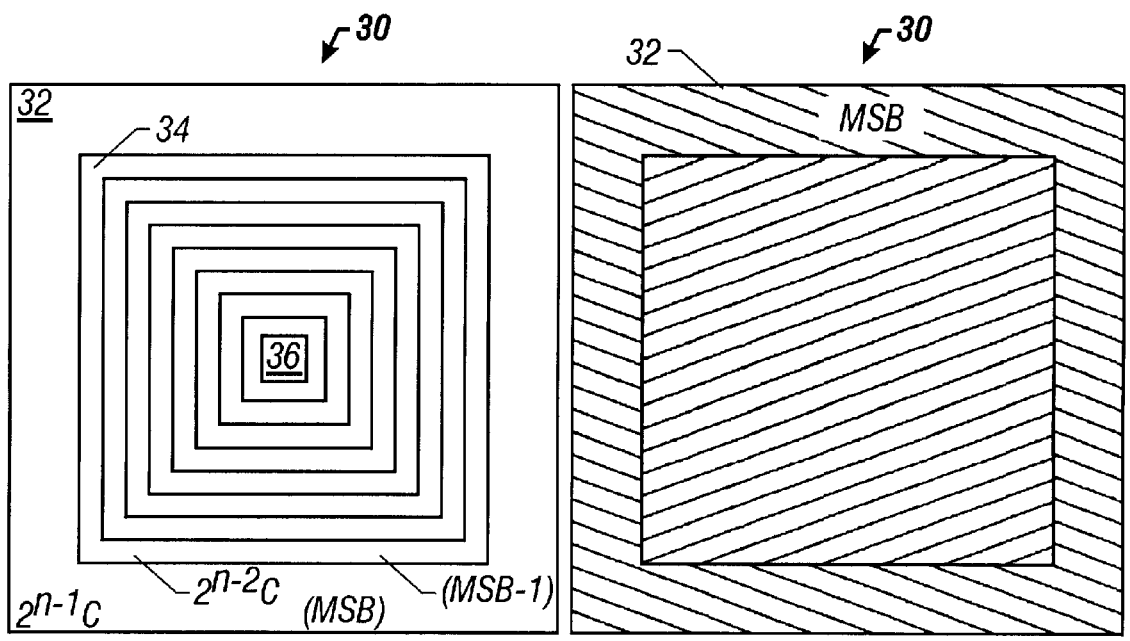
FIG. 3A
(Prior Art)
FIG. 3B
(Prior Art)
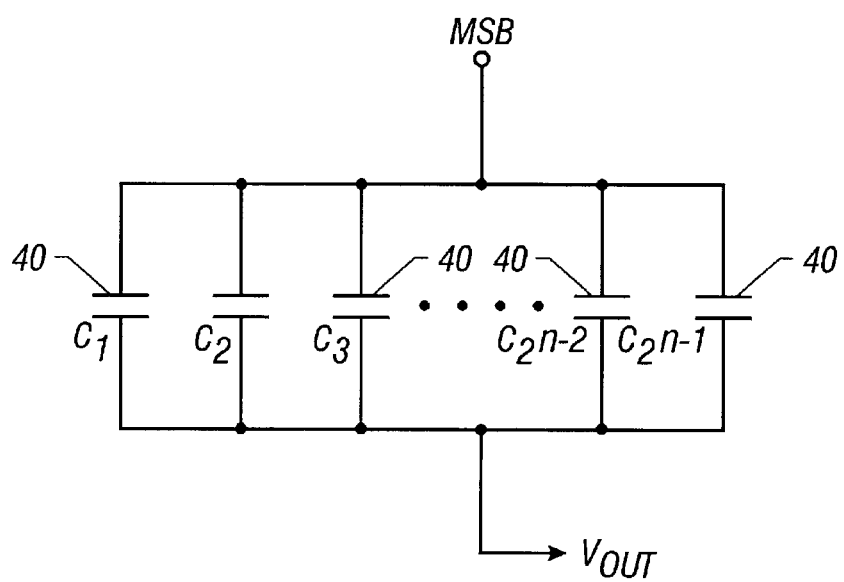
FIG. 4

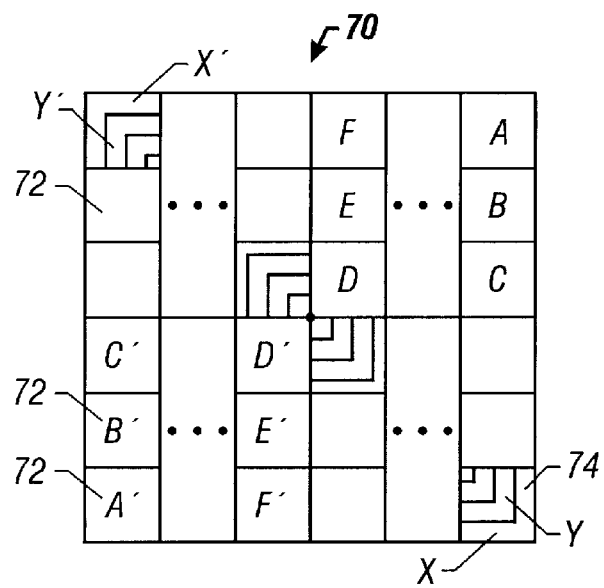
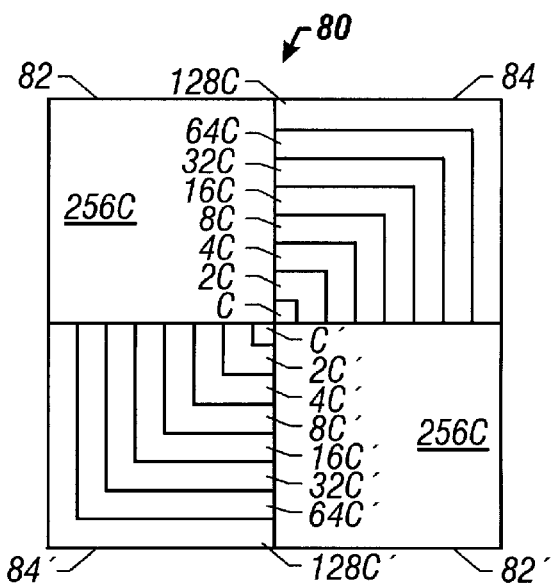
FIG. 5A  FIG. 5B
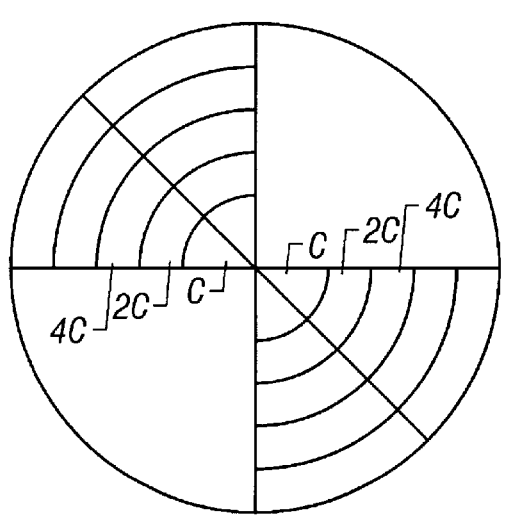
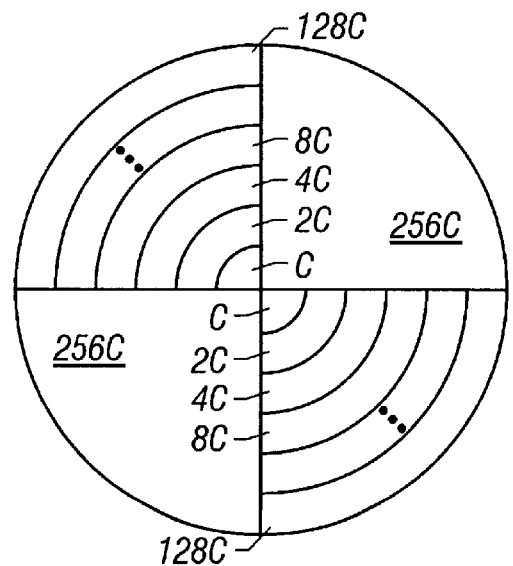
FIG. 6A  FIG. 6B

CAPACITOR ARRAY ARRANGEMENT FOR IMPROVING CAPACITOR ARRAY MATCHING

BACKGROUND OF THE INVENTION

1. Field of the Invention

This invention relates generally to capacitor arrays and, more specifically, to a capacitor array layout technique which will improve capacitor array matching.

2. Description of the Prior Art

A successive approximation analog-to-digital (A/D) converter uses a binary weighted capacitor array. For a binary search algorithm, the ideal size of these capacitors must have the following ratios: the smallest capacitor has a single unit capacitance, the next one is two units, four units, eight units, and up to $2^{n-1}$ (n being the bit resolution of the A/D converter). This requires a capacitance of 1024 units for a 10-bit A/D with the largest capacitor having 512 units. In order to guarantee one-bit accuracy, the largest capacitor must be within $(100 \times \frac{1}{2}^n)\%$ of the entire array. Otherwise, missing codes and system nonlinearities will be present.

Care must be taken when laying out the capacitor array. The capacitor array must be laid out in a way to avoid process variations. A popular way to do this is to lay out the capacitor array as a set of concentric capacitors with increasing radii based on the size of the capacitor (see FIG. 3A). Although good processing matching may be achieved, this configuration shows systematic mismatch errors.

Other matching methods may include active circuitry which calibrates the capacitor array to match the ideal ratios. Such methods may yield more accurate results, but are more costly in terms of silicon area, power consumption, and testing.

A passive way to obtain high capacitor matching is to place a small number of capacitors within a very small proximity. In addition, if a small number of capacitors are used, a thermometer code may be used to enable specific capacitors for minimizing process dependence and capacitor interaction to guarantee the presence of all codes. However, this process is very routing intensive, and does not guarantee accuracy.

Therefore, a need existed to provide an improved capacitor array arrangement. The improved capacitor array arrangement must be able to improve capacitor array matching. The improved capacitor array arrangement must be able to improve capacitor array matching in a cost effective manner (i.e., minimal amount of silicon area, power consumption, and testing). The improved capacitor array arrangement must be able to minimize mismatching due to fringe capacitance. The improved capacitor array arrangement must further be able to minimize process gradient dependence. The improved capacitor array arrangement must also be able to minimize mismatches due to macroscopic capacitor mismatches.

SUMMARY OF THE INVENTION

In accordance with one embodiment of the present invention, it is an object of the present invention to provide an improved capacitor array arrangement.

It is another object of the present invention to provide an improved capacitor array arrangement that is able to improve capacitor array matching in a cost effective manner (i.e., minimal amount of silicon area, power consumption, and testing).

It is still another object of the present invention to provide an improved capacitor array arrangement that is able to minimize mismatching due to fringe capacitance.

It is still a further object of the present invention to provide an improved capacitor array arrangement that is able to minimize process gradient dependence.

It is yet another object of the present invention to provide an improved capacitor array arrangement that is able to minimize mismatches due to macroscopic capacitor mismatches.

BRIEF DESCRIPTION OF THE PREFERRED EMBODIMENTS

In accordance with one embodiment of the present invention, a capacitor array layout technique for improving capacitor array matching is disclosed. The capacitor array layout technique comprises the steps of: providing a capacitor array; laying the capacitor array in a geometrical configuration wherein the geometrical configuration has a centerpoint; dividing the geometrical configuration into a plurality of first sections wherein each of the plurality of first sections have a corresponding second section diagonally located from the first section and at an approximately equal distance from the centerpoint as the first section; and housing in each of the second sections a capacitor set of a predetermined value wherein each of the plurality of first sections house a capacitor set of an equal value as the corresponding second section. The capacitor array layout technique may further comprise the steps of: dividing at least one of the plurality of first sections into a plurality of first sub-sections; dividing the corresponding second section of the at least one of the plurality of first sections into a plurality of second sub-sections wherein each of the plurality of first sub-sections have a corresponding second sub-section diagonally located from and at an approximately equal distance from the centerpoint; and housing in each of the plurality of first sub-sections a sub-capacitor set of a predetermined value wherein each of the plurality of first sub-sections house a sub-capacitor set of an equal value as the corresponding second sub-section.

In accordance with another embodiment of the present invention, a capacitor array layout technique for improving capacitor array matching is disclosed. The capacitor array layout technique comprises the steps of: providing a capacitor array; laying the capacitor array in a geometrical configuration wherein the geometrical configuration has a centerpoint; dividing the geometrical configuration into four equal sections wherein each of the sections shares the centerpoint, each of the sections having a corresponding section diagonally located from each of the sections; and housing in each of the sections a capacitor set of a predetermined value wherein each of the sections house a capacitor set of an equal value as the corresponding section. The capacitor array layout technique may further comprise the steps of dividing at least one of the sections into a plurality of first sub-sections; dividing the corresponding section of the at least one of the sections into a plurality of second sub-sections wherein each of the plurality of first sub-sections have a corresponding second sub-section diagonally located from at an approximately equal distance from the centerpoint; and housing in each of the first plurality of sub-sections sub-capacitor sets of predetermined values wherein each of the plurality of first sub-sections house a sub-capacitor set of an equal value as the corresponding second sub-section.

The foregoing and other objects, features, and advantages of the invention will be apparent from the following, more particular, description of the preferred embodiments of the invention, as illustrated in the accompanying drawings.

BRIEF DESCRIPTION OF THE DRAWINGS

FIG. 3A is a simplified block diagram of a prior art embodiment of the capacitor array layout used in the SAR based A/D converter depicted in FIG. 1.

FIG. 3B depicts the capacitor array mismatch for the Most Significant Bit (MSB) of the capacitor array.

FIG. 4 is a simplified schematic of one branch of the capacitor array which will reduce mismatching due to fringe capacitance.

FIG. 5A is a simplified block diagram of one embodiment of the capacitor array layout for improving capacitor array matching.

FIG. 5B is a simplified block diagram of another embodiment of the capacitor array layout for improving capacitor array matching.

FIG. 6A is a simplified block diagram of another embodiment of the capacitor array layout for improving capacitor array matching.

FIG. 6B is a simplified block diagram of another embodiment of the capacitor array layout for improving capacitor array matching.

DETAILED DESCRIPTION OF THE PREFERRED EMBODIMENTS

Figure 1:
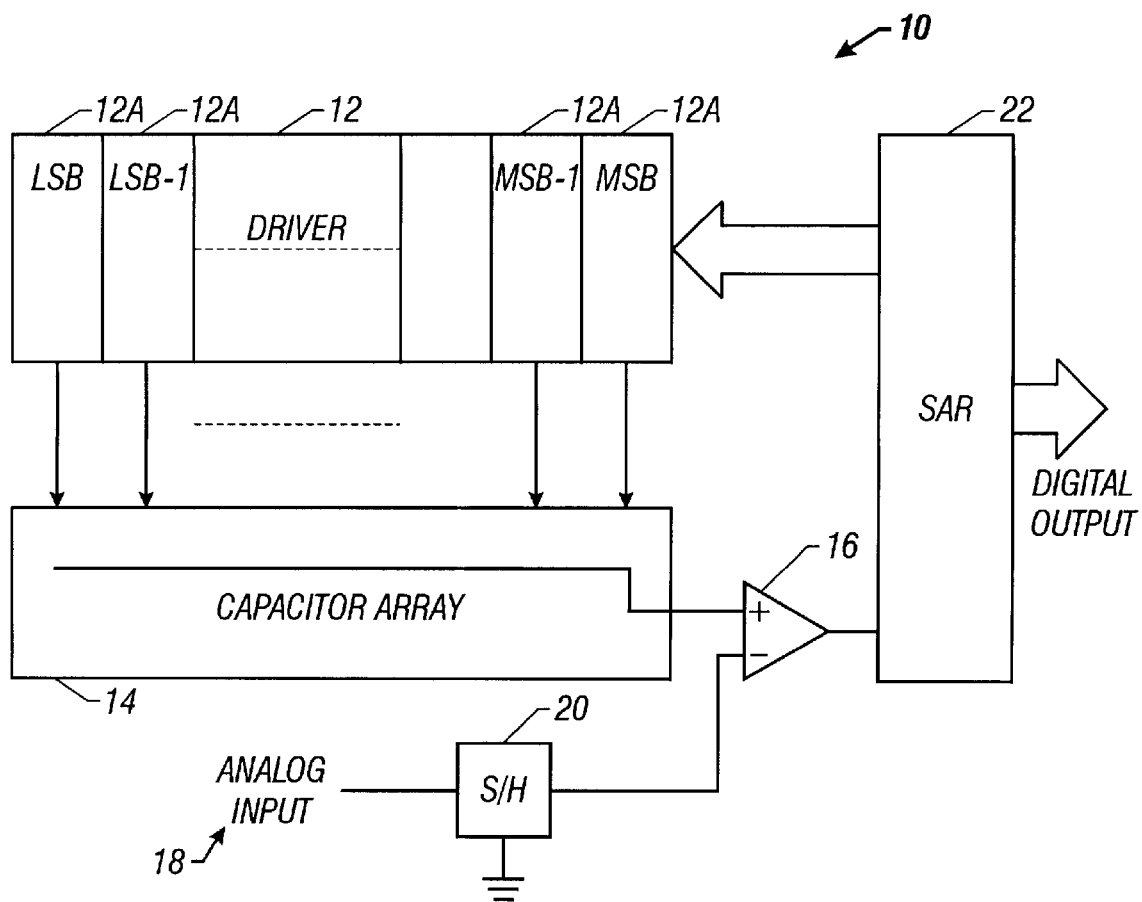
FIG. 1 is a simplified functional block diagram of a Successive Approximation Register (SAR) based Analog to Digital (A/D) converter.

Referring to FIG. 1, an Analog to Digital (A/D) converter 10 is shown. The A/D converter 10 has a driver circuit 12 which is used for driving each row of a capacitor array 14. The driver circuit 12 is comprised of a plurality of cells 12A. Each cell 12A is used to drive a specific column or bank of the capacitor array 14. By activating and deactivating each bank within the capacitor array 14, the driver circuit 12 may control the output voltage $V_{out}$ of the capacitor array 14.

Figure 2:
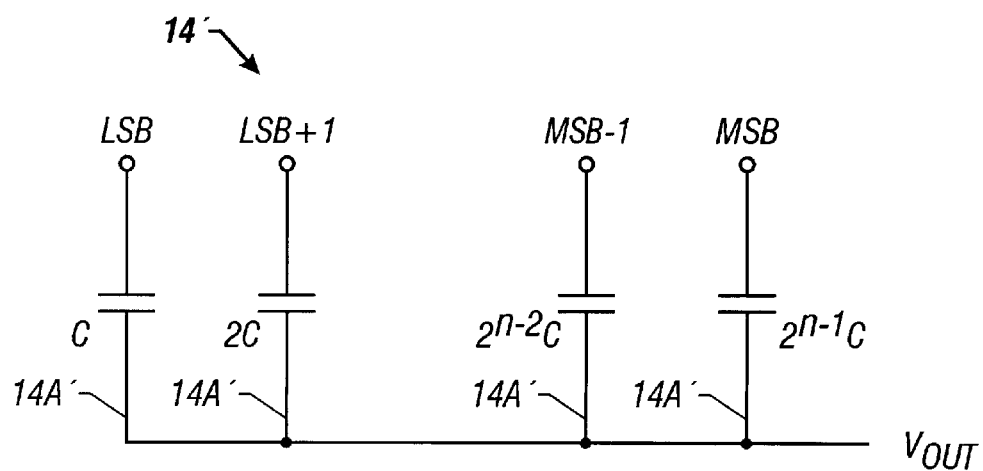
FIG. 2 is a simplified functional block diagram of the capacitor array used in the SAR based A/D converter depicted in FIG. 1.

The capacitor array 14 may take on several different embodiments. In the preferred embodiment, the capacitor array 14 takes the form of a binary weighted capacitor array 14' as depicted in FIG. 2. In the binary weighted capacitor array 14', each capacitor bank 14A' has a capacitance value ideally equal to $2^{n-1}C$ where n is an integer greater than or equal to 0 and C is the capacitive value of a unit capacitor.

Referring back to FIG. 1, the output voltage $V_{out}$ of the capacitor array 14 is sent to one input of a comparator 16. A second input of the comparator 16 is coupled to an output of a sampling circuit 20. The sampling circuit 20 has an input coupled to an analog input signal 18. The sampling circuit 20 will sample the analog signal at timed intervals and send the sampled signal to the comparator 16. The comparator 16 will then compare the voltage of the sampled signal to that of the output voltage $V_{out}$ of the capacitor array 14.

After comparing the two input voltage levels, the comparator 16 will send a signal to a Successive Approximation Register (SAR) 22 on whether the output voltage $V_{out}$ was higher or lower than the sampled voltage. The SAR 22 will then signal the driver circuit 12 on which rows of the capacitor array 14 need to be activated and/or deactivated.

Referring now to FIG. 3, a prior art capacitor array layout technique 30 is shown. The capacitor array 14' (FIG. 2) is laid out as a set of concentric capacitors with an increasing radius based on the size of the capacitor branch 14A' (FIG. 2). The MSB of the capacitor array 14' is the outer most ring 32. The MSB-1 branch of the capacitor array 14' is the ring 34. As the size of the capacitor branch 14A' decreases, the size of the ring also decreases. This continues till the LSB branch is laid as the inner most ring 36.

While the layout technique depicted in FIG. 3 may provide accurate process matching, the configuration shows systematic mismatch errors. As can be seen in FIG. 3B, during the MSB conversion, a large mismatch error occurs. In order to guarantee one bit accuracy in the A/D converter, the largest capacitor (MSB) must be within $+/-(100 \times \frac{1}{2}^{n-1})\%$ of the rest of the capacitors (C through $2^{n-2}C$). For example, for a 10-bit A/D converter, the largest capacitor must be within 511 and 513 units if C through $2^{n-2}C=512$. If the largest capacitor (MSB) is not within that range, missing codes and nonlinearities will be present. In other words, one full bit may be missed during the A/D conversion, thus leading to inaccurate results.

In order to obtain a well matched capacitor array 14' (FIG. 2), the following criteria should be implement. The capacitor array should be matching at the microscopic level. In other words, each branch 14A' of the capacitor array should be comprised of uniform unit capacitors (see FIG. 4). The capacitor array 14' should further minimize process gradient dependence. Finally, the capacitor array 14' should be matching at the macroscopic level.

Referring now to FIG. 4, in order to guarantee matching due to fringe capacitance, the capacitor array 14' (FIG. 2) must match at the microscopic level. In other words, all the branches 14A' (FIG. 2) in the capacitor array 14' should be comprised of unit capacitors 40. Thus, each capacitor branch 14A' of the capacitor array 14' would have $2^{n-1}$ unit capacitors 40 where n is an integer greater than or equal to zero. Thus, for the largest capacitor (i.e., the MSB) will contain 512 (for a 10-bit A/D converter, n=10) unit capacitors 40 coupled together in parallel instead of a single capacitor having an area 512 times that of the smallest capacitor (i.e., the LSB).

Referring back to FIGS. 3A and 3B, during the MSB conversion, the outer ring 32 (the 512 unit capacitors on a 10-bit A/D converter) is compared to the sum of the remaining capacitors (lower 512 unit capacitors). In the concentric layout, the inner or lower 512 unit capacitors has the shape of a square while the outer ring 32 or upper 512 unit capacitors takes the shape of a square ring. Based on the interaction of the various unit capacitors 40 (FIG. 4) on the neighboring unit capacitors 40, it is this difference in the macroscopic shape which causes the mismatch.

To avoid the mismatch, the capacitor array must be laid out in a way to provide identical shapes when one branch 14A' (FIG. 2) is compared to the remaining branches 14A'. Thus, the capacitor array 14' should be laid out in a geometrical configuration having a centerpoint such as a square, rectangle, circle, or the like.

Referring now to FIG. 5A, the capacitor array 14' (FIG. 2) is laid out in a geometrical configuration 70 (i.e., a square or rectangle). The geometrical configuration 70 is further divided into a plurality of sections 72. Each section 72 will have a corresponding section 72 which is located diagonally from and at an approximately equal distance from the centerpoint. For example, the section A will have a corresponding section A'. Likewise, section B will have a corresponding section B'.

Each section 72 may further be subdivided into one or more smaller sub-sections 74. Each sub-section 74 will have a corresponding sub-section 74 which is located diagonally from and at an approximately equal distance from the centerpoint. For example, the sub-section X will have a corresponding sub-section X'. Likewise, sub-section Y will have a corresponding section Y'.

Each section 72 will house a predetermined capacitive value. The corresponding section 72 will house an equal capacitive value. Likewise, each sub-section 74 will house a predetermined capacitive value and the corresponding sub-section 74 will house an equal capacitive value.

Referring now to FIG. 5B, an example of the layout technique of the present invention will be described in regards to a 10-bit A/D converter. The capacitor array 14' (FIG. 2) is laid out into the geometrical configuration 80. The geometrical configuration is divided into four equal sections. It should be noted that the geometrical configuration could be divided into more than four sections and all the sections do not have to be of equal size (see FIGS. 5A and 6A).

The first section 82 will have a corresponding section 82' (i.e., the third section). Likewise, the second section 84 will have a corresponding section 84' (i.e., the fourth section). At least one of the sections may further be divided into a plurality of sub-sections. In the embodiment depicted in FIG. 5B, the second section 84 is subdivided into 8 sub-sections (C, 2C, 4C, 8C, 16C, 32C, 64C, and 128C). Likewise, the corresponding section 84' will also be subdivided into 8 sub-sections (C', 2C', 4C', 8C', 16C', 32C', 64C', and 128C').

The capacitors of the capacitor array are then laid out into each of the sections and sub-sections. In order to avoid mismatch, the capacitor array must be laid out in a way to provide identical shapes when one of the bits of the A/D converter is compared to the remaining bits. As may be seen from FIG. 5B, sections 82 and 82' both house a capacitor sized at 256C. As stated above, sections 82 and 82' will house 256 unit sized capacitors 40 (FIG. 4) coupled together in parallel and not a single capacitor with an area 256 times that of the unit capacitor 40. Each of the sub-sections will house a capacitor equal in size to $2^{n-1}C$ where n is an integer from 0 to 8. It needs to be noted that each sub-section and corresponding sub-section needs to house equal sized capacitor values.

Under the embodiment depicted in FIG. 5B, when the MSB is energized, sections 82 and 82' will be energized while sections 84 and 84' are not energized. The capacitor array is now symmetrical around the center point. The layout technique shown in FIGS. 5A and 5B thus matches the macroscopic capacitor sizes thereby eliminating the mismatch errors with minimal process gradient impact.

Referring to FIGS. 6A and 6B, a similar layout technique is shown as that in FIGS. 5A and 5B. The main differences is that the geometrical configuration is a circle in FIGS. 6A and 6B.

It needs to be noted that not all of the bits in the A/D converter will allow symmetrical arrangements. However, the biggest mismatching errors occur when the MSB is compared to the remaining capacitors. The present layout technique allows for symmetry when the MSB is compared to the remaining capacitors thereby reducing the mismatching errors.

While the invention has been particularly shown and described with reference to preferred embodiments thereof, it will be understood by those skilled in the art that the foregoing and other changes in form, and details may be made therein without departing from the spirit and scope of the invention.

What is claimed is:

1. A capacitor array layout technique for improving capacitor array matching comprising the steps of:
   providing a capacitor array;
   laying said capacitor array in a geometrical configuration wherein said geometrical configuration has a centerpoint;
   dividing said geometrical configuration into a plurality of first sections wherein each of said plurality of first sections has a corresponding second section diagonally located from said first section and at an approximately equal distance from said centerpoint as said first section;
   dividing at least one of said plurality of first sections into a plurality of first sub-sections;
   dividing said corresponding second section of said at least one of said plurality of first sections into a plurality of second sub-sections wherein each of said plurality of first sub-sections has a corresponding second sub-section diagonally located from and at an approximately equal distance from said centerpoint;
   housing in each of said first and second sections which are not divided into a plurality of sub-sections a capacitor set of a predetermined value wherein each of said plurality of first sections which are not divided into a plurality of sub-sections house a capacitor set of an equal value as said corresponding second section; and
   housing in each of said plurality of first and second sub-sections a sub-capacitor set of a predetermined value wherein each of said plurality of first sub-sections house a sub-capacitor set of an equal value as said corresponding second sub-section and wherein the sub-capacitor sets of a divided section are of non-equal value.

2. A capacitor array layout technique for improving capacitor array matching in accordance with claim 1 wherein each of said capacitor sets of said first sections and said corresponding second sections and each of said sub-capacitor sets of said first sub-sections and corresponding second sub-sections comprise unit capacitors coupled together in parallel to obtain said predetermined values.

3. A capacitor array layout technique for improving capacitor array matching in accordance with claim 1 wherein said step of laying said capacitor array in a geometrical configuration further comprises the step of laying said capacitor array in a square configuration.

4. A capacitor array layout technique for improving capacitor array matching in accordance with claim 1 wherein said step of laying said capacitor array in a geometrical configuration further comprises the step of laying said capacitor array in a rectangular configuration.

5. A capacitor array layout technique for improving capacitor array matching in accordance with claim 1 wherein said step of laying said capacitor array in a geometrical configuration further comprises the step of laying said capacitor array in a circular configuration.

6. A capacitor array made in accordance with the method of claim 1.

7. A capacitor array layout technique for improving capacitor array matching in accordance with claim 1 wherein said step of laying said capacitor array in a geometrical configuration further comprises the step of laying said capacitor array in a symmetrical geometrical configuration.

8. A capacitor array layout technique for improving capacitor array matching according to claim 1 wherein each of the sub-capacitor sets has a capacitive value equal in size to $2^{n-1}C$ where n is an integer and C is a unit of capacitance.

9. A capacitor array layout technique for improving capacitor array matching comprising the steps of:

providing a capacitor array;

laying said capacitor array in a geometrical configuration wherein said geometrical configuration has a centerpoint;

dividing said geometrical configuration into four equal sections wherein each of said sections share said centerpoint, each of said sections having a corresponding section diagonally located from each of said sections; and housing in each of said sections a capacitor set of a predetermined value wherein each of said sections house a capacitor set of an equal value as said corresponding section.

10. A capacitor array layout technique for improving capacitor array matching in accordance with claim 9 wherein each of said capacitor sets comprise unit capacitors coupled together in parallel to obtain said predetermined value.

11. A capacitor array layout technique for improving capacitor array matching in accordance with claim 9 further comprising the steps of:

dividing at least one of said sections and said corresponding section into a plurality of first sub-sections;

dividing said corresponding section of said at least one of said sections into a plurality of second sub-sections wherein each of said plurality of first sub-sections have a corresponding second sub-section diagonally located from at an approximately equal distance from said centerpoint; and housing in each of said first plurality of sub-sections sub-capacitor sets of predetermined values wherein each of said plurality of first sub-sections house a sub-capacitor set of an equal value as said corresponding second sub-section.

12. A capacitor array layout technique for improving capacitor array matching in accordance with claim 11 wherein each of said sub-capacitor sets of said first sub-sections and said complementary second sub-sections comprise unit capacitors coupled together in parallel to obtain said predetermined values.

13. A capacitor array layout technique for improving capacitor array matching in accordance with claim 9 wherein said step of laying said capacitor array in a geometrical configuration further comprises the step of laying said capacitor array in a square configuration.

14. A capacitor array layout technique for improving capacitor array matching in accordance with claim 9 wherein said step of laying said capacitor array in a geometrical configuration further comprises the step of laying said capacitor array in a rectangular configuration.

15. A capacitor array layout technique for improving capacitor array matching in accordance with claim 9 wherein said step of laying said capacitor array in a geometrical configuration further comprises the step of laying said capacitor array in a circular configuration.

16. A capacitor array made in accordance with the method of claim 9.

17. A capacitor array layout technique for improving capacitor array matching comprising the steps of:

providing a capacitor array;

laying said capacitor array in a geometrical configuration wherein said geometrical configuration has a centerpoint;

dividing said geometrical configuration into a plurality of first sections wherein each of said plurality of first sections has a corresponding second section diagonally located from said first section and at an approximately equal distance from said centerpoint as said first section;

dividing at least one of said plurality of first sections into a plurality of first sub-sections;

dividing said corresponding second section of said at least one of said plurality of first sections into a plurality of second sub-sections wherein each of said plurality of first sub-sections has a corresponding second sub-section diagonally located from and at an approximately equal distance from said centerpoint;

housing in each of said plurality of first and second sub-sections a sub-capacitor set of a predetermined value wherein each of said plurality of first sub-sections house a sub-capacitor set of an equal value as said corresponding second sub-section and wherein the sub-capacitor sets of a divided section are of non-equal value;

housing in each of said first sections which are not divided into a plurality of first sub-sections a capacitor set of a predetermined value wherein each of said corresponding second sections of said first sections which are not divided into a plurality of first sub-sections house a capacitor set of an equal value.

18. A capacitor array layout technique for improving capacitor array matching in accordance with claim 17 wherein each of said capacitor sets of said first section and said corresponding second section comprise unit capacitors coupled together in parallel to obtain said predetermined value.

19. A capacitor array layout technique for improving capacitor array matching in accordance with claim 17 wherein each of said first sub-capacitor sets and each of said second sub-capacitor sets comprise unit capacitors coupled together in parallel to obtain said predetermined value.

20. A capacitor array layout technique for improving capacitor array matching in accordance with claim 17 wherein said step of laying said capacitor array in a geometrical configuration further comprises the step of laying said capacitor array in a square configuration.

21. A capacitor array layout technique for improving capacitor array matching in accordance with claim 17 wherein said step of laying said capacitor array in a geometrical configuration further comprises the step of laying said capacitor array in a rectangular configuration.

22. A capacitor array layout technique for improving capacitor array matching in accordance with claim 17 wherein said step of laying said capacitor array in a geometrical configuration further comprises the step of laying said capacitor array in a circular configuration.

23. A capacitor array made in accordance with the method of claim 17.

24. A capacitor array layout technique for improving capacitor array matching according to claim 17 wherein each of the sub-capacitor sets has a capacitive value equal in size to $2^{n-1}C$ where n is an integer and C is a unit of capacitance.

25. A capacitor array layout technique for improving capacitor array matching comprising the steps of:

providing a capacitor array;

laying said capacitor array in a circular geometrical configuration wherein said geometrical configuration has a centerpoint;

dividing said geometrical configuration into a plurality of first sections wherein each of said plurality of first sections has a corresponding second section diagonally located from said first section and at an approximately equal distance from said centerpoint as said first section;

housing in each of said first and second sections a capacitor set of a predetermined value wherein each of said plurality of first sections house a capacitor set of an equal value as said corresponding second section.

26. A capacitor array layout technique for improving capacitor array matching comprising the steps of:

providing a capacitor array;

laying said capacitor array in a circular geometrical configuration wherein said geometrical configuration has a centerpoint;

dividing said geometrical configuration into four equal sections wherein each of said sections share said centerpoint, each of said sections having a corresponding section diagonally located from each of said sections; and housing in each of said sections a capacitor set of a predetermined value wherein each of said sections house a capacitor set of an equal value as said corresponding section.

27. A capacitor array layout technique for improving capacitor array matching comprising the steps of:

providing a capacitor array;

laying said capacitor array in a circular geometrical configuration wherein said geometrical configuration has a centerpoint;

dividing said geometrical configuration into a plurality of first sections wherein each of said plurality of first sections has a corresponding second section diagonally located from said first section and at an approximately equal distance from said centerpoint as said first section;

dividing at least one of said plurality of first sections into a plurality of first sub-sections;

dividing said corresponding second section of said at least one of said plurality of first sections into a plurality of second sub-sections wherein each of said plurality of first sub-sections has a corresponding second sub-section diagonally located from and at an approximately equal distance from said centerpoint;

housing in each of said plurality of first and second sub-sections a sub-capacitor set of a predetermined value wherein each of said plurality of first sub-sections house a sub-capacitor set of an equal value as said corresponding second sub-section;

housing in each of said first sections which are not divided into a plurality of first sub-sections a capacitor set of a predetermined value wherein each of said corresponding second sections of said first sections which are not divided into a plurality of first sub-sections house a capacitor set of an equal value.

* * * * *